United States Patent [19]

Teng

[11] Patent Number: 6,071,675

[45] Date of Patent: Jun. 6, 2000

[54] ON-PRESS DEVELOPMENT OF A LITHOGRAPHIC PLATE COMPRISING DISPERSED SOLID PARTICLES

[76] Inventor: Gary Ganghui Teng, 10 Kendall Dr., Nothborough, Mass. 01532

[21] Appl. No.: 09/327,348

[22] Filed: Jun. 5, 1999

[51] Int. Cl.[7] .................................................. G03F 7/36
[52] U.S. Cl. ............................................ 430/302; 101/452
[58] Field of Search .............................. 430/302; 101/452

[56] References Cited

U.S. PATENT DOCUMENTS

| | | | |
|---|---|---|---|
| 3,997,349 | 12/1976 | Sanders | 96/75 |
| 5,258,263 | 11/1993 | Cheema et al. | 430/309 |
| 5,395,734 | 3/1995 | Vogel et al. | 430/270.1 |
| 5,407,764 | 4/1995 | Cheema et al. | 430/15 |
| 5,516,620 | 5/1996 | Cheng et al. | 430/138 |
| 5,616,449 | 4/1997 | Cheng et al. | 430/302 |
| 5,677,110 | 10/1997 | Chia et al. | 430/302 |
| 5,811,220 | 9/1998 | Cheng et al. | 430/302 |

Primary Examiner—Cynthia Hamilton

[57] ABSTRACT

This invention discloses a negative-working on-press developable lithographic printing plate utilizing a non-hydrophilic solid particulate dispersion in the photosensitive layer to enhance on-press developability and non-tackiness of lithographic printing plate. The photosensitive layer is capable of being softened and dispersed by ink, and the plate can be developed on a printing press equipped with ink and fountain solution during regular press operation. Incorporation of non-hydrophilic particles can improve on-press developability or reduce tackiness without sacrificing other properties.

20 Claims, No Drawings

ON-PRESS DEVELOPMENT OF A LITHOGRAPHIC PLATE COMPRISING DISPERSED SOLID PARTICLES

FIELD OF THE INVENTION

This invention relates to on-press developable lithographic printing plates. More particularly, it relates to on-press developable lithographic plates utilizing dispersed non-hydrophilic solid particles in the oleophilic photosensitive layer to enhance on-press developability and non-tackiness.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate. Conventionally, the actinic radiation is from a lamp (usually an ultraviolet lamp) and the image pattern is generally determined by a photomask which is placed between the light source and the plate. With the advance of laser and computer technologies, laser sources have been increasingly used to directly expose a printing plate which is sensitized to a corresponding laser wavelength; photomask is unnecessary in this case.

Currently, most commercial lithographic plates require a development process after the plates being exposed and before put on press. A liquid developer is used to dissolve and clean off the non-exposed areas (for negative plate) or the exposed areas (for positive plates). Such a development process is time and labor consuming and generates wet waste. It would be desirable that such a tedious development process can be eliminated.

Lithographic plates which do not require any intermediate development of the photosensitive layer are disclosed in U.S. Pat. No. 3,997,349 (Sanders), U.S. Pat. No. 5,395,734 (Vogel), and U.S. Pat. No. 5,665,522 (Vogel et al). The photosensitive layer of the plates, upon irradiation, becomes more or less hydrophilic in the exposed areas. Such plates are called no-process plates. While the simplicity of these plates are attractive, such plates often suffer from background toning after a certain press run length.

On-press developable lithographic printing plates have been disclosed in the literature. Such plates can be directly mounted on press after exposure to develop with ink and/or fountain solution during the initial prints and then to print out regular printed sheets. No separate development process before mounting on press is needed. Therefore, such plates are also called no-process plates commercially. However, for the purpose of clarity and simplicity, in this patent, such plates will only be referred as on-press developable plates. Among the on-press developable lithographic printing plates are U.S. Pat. No. 5,258,263 (Cheema, et al), U.S. Pat. No. 5,407,764 (Cheema, et al), U.S. Pat. No. 5,516,620 (Cheng, et al), U.S. Pat. No. 5,561,029 (Fitzgerald, et al), U.S. Pat. No. 5,616,449 (Cheng, et al), U.S. Pat. No. 5,677,110 (Chia, et al), and U.S. Pat. No. 5,811,220 (Cheng, et al).

In order for an on-press developable plate to be useful, the non-hardened areas should be able to be cleaned off completely on press with ink and/or fountain solution during the initial press operation. Acceptable printed sheets should be achieved after the first several prints. Therefore, the non-hardened areas of the photosensitive layer should be able to be softened and dispersed by ink and/or fountain solution within seconds; the softened and dispersed areas of the photosensitive layer will be removed by the press offset roller and printing papers.

One formulation approach to designing negative-working on-press developable lithographic plates is to use an oleophilic photosensitive layer which is softenable and dispersible by press ink so that the unexposed areas of the photosensitive layer can be quickly removed on a wet press equipped with ink and fountain solution during regular press operation. Because press ink is usually a highly viscous and paste-like material, the photosensitive layer (unexposed) has to be capable of being quickly softened and dispersed upon contact with ink or combination of ink and fountain solution and being completely removed on press (on-press developability). At the mean time, the photosensitive layer has to be dry (non-tacky) enough so that the plate can be conveniently handled. To have good on-press developability while maintaining non-tackiness is an extremely challenging task. It is very difficult to formulate a photosensitive layer which has good on-press developability, non-tackiness, and durability. For example, for a photosensitive layer consisting of oleophilic polymeric binders, crosslinkable monomers, photoinitiators, and certain additives, increase in monomer content will give better on-press developability but will result in tackier coating; likewise, reduction in monomer content will give less tackier or non-tacky coating but will result in poorer on-press developability. Various formulation approaches have been used to address the above challenge.

U.S. Pat. Nos. 5,258,263 and 5,407,764 (Cheema, et al) describe an on-press developable lithographic printing plate using a photosensitive hydrophilic water-insoluble layer between a hydrophilic substrate and an oleophilic photosensitive layer to improve on-press developability.

U.S. Pat. No. 5,516,620 (Cheng, et al) describes incorporation of a plurality of microencapsulated developers in on-press developable lithographic plates. The microencapsulated developers may be integrated into the photosensitive layer, or may form a separate layer deposited atop the photosensitive layer. The microencapsulated developers after rupture helps soften the photosensitive layer and allows improved on-press developability.

U.S. Pat. No. 5,616,449 (Cheng, et al) describes the use of rubber and surfactant to enhance the durability and resolution of on-press developable lithographic plates. The rubber is preferably incorporated into the photosensitive layer as discrete particulate rubber.

U.S. Pat. No. 5,677,108 (Chia, et al) describes coating atop an on-press developable photosensitive layer a polymeric protective overcoat containing a hydrophilic polymeric quencher. U.S. Pat. No. 5,677,110 (Chia, et al) describes coating atop an on-press developable photosensitive layer a polymeric protective overcoat containing a water or fountain solution soluble or dispersible crystalline compound. Application of the overcoat reduces the tackiness of the photosensitive layer, among other suggested advantages.

U.S. Pat. No. 5,795,698 (Fitzgerald, et al) describes an on-press developable lithographic plate with addition of an amphoteric hydrogen bond-forming developability stabilizer in the photosensitive layer.

U.S. Pat. No. 5,811,220 (Cheng, et al) describes an on-press developable lithographic plate with incorporation of a hygroscopic microgel in the photosensitive layer. The microgel comprises crosslinked polymeric particulate beads with the outer surfaces of said beads being hydrophilic. The incorporation of hygroscopic microgel reduces tackiness and improves the developability of the plate.

Despite the progresses made in the aforementioned patents, none of the plates can provide satisfactory performance in all aspects, in terms of non-tackiness, good on-press developability, good press durability, and ease of manufacturing. The plates with microencapsulated developers, dispersed rubber or hygroscopic hydrogel require complicated manufacturing process. Putting an overcoat on a tacky plate reduces but does not completely eliminate the tackiness. Therefore, there is a continuing need for an on-press developable lithographic printing plate which has good on-press developability, no tackiness, simple manufacturing process, and good durability.

I have found, surprisingly, that addition of dispersed non-hydrophilic solid particles into the oleophilic photosensitive layer of an on-press developable lithographic plate can improve on-press developability and also reduce tackiness, or reduce tackiness without sacrificing on-press developability. Good durability and good shelf-life stability are also obtained with such a plate.

Although addition of dispersed particles (such as a pigment dispersion) in a photosensitive layer of conventional lithographic plates is well known, addition of non-hydrophilic solid particles (including a pigment dispersion) into the oleophilic photosensitive layer of an on-press developable plate is unexpected because of the following reasons. (1) Addition of non-hydrophilic solid particles would be expected to reduce on-press developability of the plate because such particles are expected to cause some residues on the substrate in the developed areas (leading to background toning). Since achieving good on-press developability has been a major challenge for on-press developable plates, any approaches which may adversely affect the on-press developability of the plates are generally avoided by the researchers. (2) Prior art literature on on-press developable plates has been teaching incorporating hydrophilic particles to improve both developability and non-tackiness.

SUMMARY OF THE INVENTION

It is an object of the present invention to provide an on-press developable lithographic printing plate with good on-press developability, low or no tackiness, good durability, good shelf-life stability, and simple manufacturing process.

It is another object of this invention to incorporate dispersed non-hydrophilic solid particles in the oleophilic photosensitive layer of an on-press developable lithographic plate, to improve on-press developability and/or reduce tackiness while allowing good durability, and good overall performance.

Further objects, features and advantages of the present invention will become apparent from the detailed description of the preferred embodiments.

According to the present invention, there has been provided a method of lithographically printing images on a receiving medium, comprising in order:

(a) providing a negative-working lithographic plate comprising:
  (i) a printing plate substrate with a hydrophilic surface on at least one side; and
  (ii) an oleophilic photosensitive layer deposited on the hydrophilic surface, said photosensitive layer comprising a photohardenable composition, and a non-hydrophilic solid particulate dispersion; wherein the unexposed areas of said photosensitive layer are softenable and dispersible by ink;

(b) exposing said lithographic plate with an actinic radiation to cause hardening of the exposed areas;

(c) directly placing the exposed plate on a printing press equipped with ink and fountain solution; and (d) operating said printing press to contact said exposed plate with ink and fountain solution to remove the photosensitive layer in the unexposed areas, and to lithographically print images from said plate to the receiving sheets.

DETAILED DESCRIPTION OF THE PREFERRED EMBODIMENTS

The support employed in the on-press developable lithographic plates of this invention can be any support which provides a hydrophilic surface. Such a support may be a metal sheet, a polymer film, or a coated paper. Aluminum (including aluminum alloys) sheet is a preferred support. Particularly preferred is an aluminum support which has been grained, anodized, and deposited with a hydrophilic barrier layer. Surface graining (or roughening) can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic printing plate application are well known in the art, and examples can be found in U.S. Pat. Nos. 2,714,066, 4,153,461, 4,399,021, and 5,368,974.

The photosensitive layer is also called radiation-sensitive layer. Any photosensitive layer which comprises a radiation-hardenable composition and a non-hydrophilic solid particulate dispersion can be used in this invention, provided that the photosensitive layer is also softenable and dispersible by ink. The unexposed areas of the plate must be capable of being quickly softened and dispersed by press ink in order to be developed on a wet press equipped with ink and fountain solution during the beginning prints of regular press operation. The photosensitive layer is deposited on the hydrophilic substrate to form a lithographic plate which is suitable for on-press development. In this patent, the term "softenable and dispersible by ink" is defined as that the photosensitive layer can be made soft and incoherent by contact with ink (usually also under a pressing action from press rollers) and can therefore be developed off on a wet press equipped with ink and fountain solution.

The photosensitive layer may consist of, at least, an oleophilic polymeric binder (with or without crosslinkable groups), a crosslinkable monomer, a photoinitiator, and a non-hydrophilic solid particulate dispersion; wherein the unexposed areas of said photosensitive layer is softenable and dispersible by ink.

In a preferred embodiment, the radiation-sensitive layer comprises, at least, a polymeric binder (with or without ethylenic functionality), a free radical crosslinkable ethylenically unsaturated monomer (or oligomer) having at least one terminal ethylenic group, a photosensitive free-radical initiator (including sensitizer), and a non-hydrophilic solid particulate dispersion. Other additives such as surfactant, colorant, exposure indicator (such as leuco crystal violet, azobenzene, 4-phenylazodiphenylamine, and methylene blue dyes), and free-radical stabilizer (such as methoxyhydroquinone) may be added. Suitable polymeric binders include polystyrene, acrylic polymers and copolymers (such as polybutylmethacrylate, polyethylmethacrylate, polymethylmethacrylate, polymethylacrylate, butylmethacrylate/methylmethacrylate copolymer), polyvinyl acetate, polyvinyl chloride, styrene/acrylonitrile copolymer, nitrocellulose, cellulose acetate butyrate, cellulose acetate propionate, vinyl chloride/vinyl acetate copolymer, partially hydrolyzed polyvinyl acetate, polyvinyl alcohol partially condensation-reacted with acetaldehyde, and butadiene/acrylonitrile copolymer. Suitable free-radical polymerizable monomers (including oligomers) include multifunctional acrylate monomers or oligomers, such as acrylate and methacrylate esters of ethylene glycol, trimethylolpropane, pentaerythritol, ethoxylated ethylene glycol and ethoxylated trimethylolpropane, multifunctional urethanated acrylate and methacrylate (such as Sartomer CN970 and CN975 from Sartomer Company, Exton, Pa.), and epoxylated acrylate or methacrylate (such as Sartomer CN104 and CN120 from Sartomer Company, Exton, Pa.), and oligomeric amine diacrylates. Suitable radiation-sensitive free-radical initiators include the derivatives of acetophenone (such as 2,2-dimethoxy-2-phenylacetophenone, and 2-methyl-1-[4-(methylthio)phenyl]-2-morpholino propan-1-one), benzophenone, benzil, ketocoumarin (such as 3-benzoyl-7-methoxy coumarin and 7-methoxy coumarin), xanthone, thioxanthone, benzoin or an alkyl-substituted anthraquinone, s-triazine, and titanocene (bis($\eta^9$-2,4-cyclopentadien-1-yl), bis[2,6-difluoro-3-(1H-pyrrol-1-yl)phenyl) titanium).

In another preferred embodiment, the photosensitive layer comprises, at least, a polymeric binder (with or without vinyl ether or epoxy functional groups), a monomer (or oligomer) with one or more vinyl ether or epoxy functional groups, a cationic photoinitiator (including sensitizer), and a non-hydrophilic solid particulate dispersion. Other additives such as surfactant, colorant, stabilizer, and exposure indicator can be added. Examples of useful polymeric binders are polybutylmethacrylate, polymethylmethacrylate and cellulose acetate butyrate. Examples of useful epoxy monomers are 3,4-epoxycyclohexylmethyl-3,4-epoxycyclohexane carboxylate, bis-(3,4-epoxycyclohexymethyl) adipate, difunctional bisphenol A/epichlorohydrin epoxy resin and multifunctional epichlorohydrin/tetraphenylol ethane epoxy resin. Examples of useful cationic photoinitiators are triarylsulfonium hexafluoroantimonate and triarylsulfonium hexafluorophosphate. Examples of stabilizers are basic compounds such as triethylamine, dimethylethanolamine, pyridine, and tetraethylamine acetate.

The dispersed non-hydrophilic particles can be any particulate solid materials which are not particularly hydrophilic (such as hygroscopic microgels as described in U.S. Pat. No. 5,811,220, or silicate described in U.S. Pat. No. 5,616,449) or elastic (as for dispersed rubber described in U.S. Pat. No. 5,616,449), and are not soluble in the monomers of the photosensitive layer. The dispersed non-hydrophilic particles should have an average size from about 0.01 to about 2.0 micrometer and more preferably from about 0.05 to about 1.0 micrometer. The dispersed non-hydrophilic particles should be added in an amount from about 0.5 to about 40% of the total photosensitive layer and preferably from about 2 to about 15% of the total photosensitive layer. A wide variety of particulate materials are well known and can be used in the photosensitive layer of this invention. Particulate materials useful in this current invention include, but are not limited to, inorganic particulate materials such as ground metals, minerals, glasses, inorganic pigments, and inorganic coating fillers; organic particulate materials such as dispersions of organic pigments and dispersions of polymer coated pigments; and particulate polymeric materials such as powders or dispersions of insoluble polymers or crosslinked polymers. Examples of inorganic particulate materials are ground titanium dioxide, talc, iron oxide, glass, and aluminum. Examples of organic particulate materials are dispersions of various phthalocyanine pigments including copper phthalocyanine and chlorinated copper phthalocyanine. Pigment dispersions with the pigment particles being pre-encapsulated in photopolymerizable resins, as disclosed in U.S. Pat. No. 5,286,594 (Sypek, et al), can also be used. Examples of polymeric particulate materials are polyethylene and polypropylene dispersions. The particulate material may be added into the photosensitive layer formulation as liquid, paste or solid dispersion (usually dispersed with a polymer and other dispersing aids), or as powder. It is preferred that the particulate material is homogeneously dispersed in the photosensitive layer; however, it is natural and often acceptable that certain aggregation of the particles may take plate in the photosensitive layer.

In this patent, the term "particulate dispersion" refers to particles which can be dispersed in the photosensitive layer or photosensitive layer formulation. The particulate dispersion can be in a solid form (such as powder), dispersed in a solid material (such as a polymeric dispersant), or dispersed in a liquid carrier (such as an aqueous dispersion).

Various surfactants may be added into the photosensitive formulation to stabilize the particulate dispersion or to improve the developability. Both polymeric and small molecule surfactants can be used. However, it is preferred that the surfactant has low or no volatility so that it will not evaporate from the photosensitive layer of the plate during storage and handling. Nonionic surfactants are usually preferred. The nonionic surfactant used in this invention should have sufficient portion of hydrophilic segments (or groups) and sufficient portion of oleophilic segments (or groups), so that it is at least partially soluble in water (>1 g surfactant soluble in 100 g water) and at least partially soluble in organic phase (>1 g surfactant soluble in 100 g photosensitive layer). Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (such as Tergitol MIMFOAM from Union Carbide, and Pluronic L43, L64, 1107, P103 and 10R5 from BASF); ethoxylated or propoxylated acrylate oligomers (such as polyethoxylated (20) trimethylolpropane triacrylate, polyethylene glycol (600) diacrylate, and polypropoxylated (6) trimethylolpropane triacrylate, SR415, SR610, and SR501, respectively, from Sartomer Company, Exton, Pa.); and polyethoxylated alkylphenols and polyethoxylated fatty alcohols (such as Triton X-100, Triton X-102, Triton X-165, Triton X-305, Triton X-405, Triton X-705, Triton X-45, Triton X-114, Triton CF-10, Triton CA, and Triton DF-12 from Union Carbide).

A water soluble or dispersible protective overcoat may be deposited on top of the photosensitive layer to, for example, protect the photosensitive layer from oxygen inhibition, contamination and physical damage during handling. For plates with rough and/or porous hydrophilic surface, a thin water soluble or dispersible interlayer as described in U.S. patent application Ser. No. 09/036,881, the entire disclosure of which is hereby incorporated by reference, may be deposited between the substrate and the photosensitive layer, wherein the substrate surface is rough and/or porous enough and the interlayer is thin enough to allow bonding between the photosensitive layer and the substrate through mechanical interlocking.

The radiation used for exposing the photosensitive layer can be a conventional light source, such as a high pressure mercury lamp, a xenon lamp, or a fluorescence lamp (usually requiring a mask), or can be a laser source (or a focused regular light source) which directly images according to digital imaging information. The radiation can be a UV light, a visible light, or a near infrared light, depending on the sensitization of the photosensitive layer. For infrared light imagable plate, an infrared absorbing dye or pigment may be added to the photosensitive layer. In this patent, any radiation which can directly or indirectly cause hardening of the photosensitive layer in the exposed areas is called actinic radiation.

The invention is further illustrated by the following examples of its practice. Unless specified, all the values are by weight. Neocryl B-728 is a polymethylmethacrylate polymer from Zeneca; Ebecryl RX8301 is an acrylated urethane oligomer from UCB Chemicals; Sartomer SR-399 is a pentafunctional acrylic monomer from Sartomer; Irgacure 907 is a free radical initiator from Ciba-Geigy; isopropyl thioxanthone is an initiator/sensitizer; Triazine B [2,4-bis(trichloromethyl)-6-(1-(4-methoxy)naphthyl)-1,3,5-triazine] is a free radical initiator; methoxyether hydroquinone, BHT (2,6-ter-dibutyl 4-methylphenyl), and Irganox 1035 (from Ciba-Geigy) are free-radical quenchers; Microlitho Green G-K and Microlith White R-K are halogenated phthalocyanine pigment dispersion and titanium dioxide pigment dispersion, respectively, from Ciba-Geigy; Orasol Blue GN is a blue dye from Ciba-Geigy; leuco crystal violet is an exposure indicator; and Pluronic L43 is a nonionic surfactant (ethylene glycol-propylene glycol copolymer) from BASF.

EXAMPLE 1

This example demonstrates that addition of a non-hydrophilic particulate solid dispersion (including pigment dispersion) into the oleophilic photosensitive layer of an on-press developable plate can improve its on-press developability and non-tackiness.

Aluminum sheets which had been AC electrochemically roughened, anodized, and thermally treated with 0.1% polyvinyl phosphonic acid aqueous solution (65° C. for 4 min, followed by water rinse) were used as the plate substrates. The aluminum substrate was coated using a #6 Meyer rod with a photosensitive layer (10% solids in methylethylketone) to achieve a dry coverage of about 1.1 g/m$^2$, followed by drying in an oven at 80° C. for 10 min. The solid weight ratios of photosensitive layer formulations are tabulated below:

| Material | Formula A | Formula B | Formula C | Formula D |
| --- | --- | --- | --- | --- |
| Neocryl B-728 | 35.687 | 34.238 | 33.175 | 30.289 |
| Sartomer SR399 | 51.793 | 49.690 | 48.147 | 43.959 |
| Pluronic L43 | 4.277 | 4.103 | 3.976 | 3.630 |
| Leuco crystal violet | 1.337 | 1.282 | 1.242 | 1.134 |
| BHT | 0.111 | 0.107 | 0.104 | 0.095 |
| Irganox 1035 | 0.111 | 0.107 | 0.104 | 0.095 |
| Irgacure 907 | 4.455 | 4.274 | 4.142 | 3.781 |
| ITX | 2.228 | 2.137 | 2.071 | 1.891 |
| Microlith Green G-K | 0.000 | 4.061 | 7.041 | 15.126 |

The plates prepared above (one day old) were first evaluated by hand for tackiness. The plates were then hand tested for on-press developability and durability. The plates were placed under a UGRA target mask in a vacuum frame and exposed to a UV light with an emission peak at about 364 nm for 5 min. (to achieve a Stouffer step of about 4 in a 21-step Stouffer sensitivity guide). The exposed plates were rubbed 10 times with a cloth damped with both fountain solution (prepared from Superlene Brand All Purpose Fountain Solution Concentrate made by Varn, Oakland, N.J.) and ink (Sprinks 700 Acrylic Black ink from Sprinks Ink, Fla.) to check on-press developability and inking; additional 200 rubs (Each back-and-forth counts one rub.) were performed to check the durability of the plate. The on-press developability was rated using a 1–5 scale: "1"—not developed after 10 rubs; "2"—partially developed after 6 rubs; "3"—completely developed after 6 rubs; "4"—completely developed after 4 rubs; "5"—completely developed within 2 rubs (the best). All the plates showed good durability (no wearing off at 200 rubs). The tackiness and developability results are listed in the following table.

| Material | Formula A | Formula B | Formula C | Formula D |
| --- | --- | --- | --- | --- |
| Microlith Green G-K | 0.000 | 4.061 | 7.041 | 15.126 |
| Tackiness | Medium tacky | Slight tacky | Non-tacky | Non-tacky |
| On-press developability | 3 | 5 | 4 | 3 |

EXAMPLE 2

In this example, the photosensitive layers were the same as in EXAMPLE 1 except that the substrates used in EXAMPLE 1 were further coated with a thin releasable interlayer (a water-soluble polymer) before coating the photosensitive layer. AC electrochemical grained, anodized and polyvinyl phosphonic acid treated aluminum substrates were first coated with a 0.5% aqueous solution of Airvol 540 with a #6 Meyer rod to achieve a dry coverage of about 0.05 g/m$^2$, followed by drying in an oven at 100° C. for 5 min. The polyvinyl alcohol coated substrates were further coated with the photosensitive layer formulations as listed in EXAMPLE 1 with a #6 Meyer rod to achieve a dry coating coverage of about 1.1 g/m$^2$.

The plates obtained were evaluated with the same procedures as in Example 1. All the plates showed good press durability. The tackiness and developability results are listed in the following table.

| Material | Formula A | Formula B | Formula C | Formula D |
|---|---|---|---|---|
| Microlith Green G-K | 0.000 | 4.061 | 7.041 | 15.126 |
| Tackiness | Medium tacky | Slight tacky | Non-tacky | Non-tacky |
| On-press developability | 4 | 5 | 5 | 4 |

EXAMPLE 3

In this example, the plates were the same as in example 2 except that the substrate was a mechanically grained (Ra=about 0.5 micron), anodized, and polyvinyl phosphonic acid thermally treated aluminum.

The plates obtained were evaluated with the same procedures as in Example 1. All the plates showed good press durability. The tackiness and developability results are listed in the following table.

| Material | Formula A | Formula B | Formula C | Formula D |
|---|---|---|---|---|
| Microlith Green G-K | 0.000 | 4.061 | 7.041 | 15.126 |
| Tackiness | Medium tacky | Slight tacky | Non-tacky | Non-tacky |
| On-press developability | 3 | 4 | 4 | 3 |

EXAMPLE 4

In this example, an inorganic particulate dispersion (titanium dioxide) was added into a photosensitive layer to improve on-press developability and non-tackiness. The titanium dioxide dispersion (Microlith White R-K, from Ciba-Geigy) was added into the photosensitive formulation with fast stirring until completely dispersed. All formulations were prepared as 10% solids. Plates were prepared as described in EXAMPLE 1 except that the following photosensitive layer formulations (solid weight ratios listed) are used.

| Material | Formula E | Formula F | Formula G |
|---|---|---|---|
| Neocryl B-728 | 37.378 | 35.711 | 34.187 |
| Sartomer SR454 | 7.490 | 7.156 | 6.850 |
| Sartomer SR399 | 46.757 | 44.672 | 42.766 |
| Pluronic L43 | 4.666 | 4.458 | 4.268 |
| Leuco crystal violet | 1.400 | 1.337 | 1.280 |
| MEHQ | 0.105 | 0.100 | 0.096 |
| Irganox 1035 | 0.105 | 0.100 | 0.096 |
| Triazine B | 2.100 | 2.006 | 1.921 |
| Microlith White R-K | 0.000 | 4.458 | 8.536 |

The plates were evaluated with the same procedures as in Example 1. All the plates showed good press durability. The tackiness and developability results are listed in the following table.

| Material | Formula E | Formula F | Formula G |
|---|---|---|---|
| Polyemulsion 325G | 0.000 | 4.458 | 8.536 |
| Tackiness | Medium tacky | Slight tacky | Non-tacky |
| On-press developability | 3 | 4 | 3 |

EXAMPLE 5

In this example, a polymeric particulate dispersion was used instead of a pigment dispersion and 1-methoxy-2-propanol was used as the solvent. The polymeric particulate dispersion (Polyemulsion 325G, 25% polyethylene aqueous emulsion) was added into the photosensitive formulation with fast stirring. All formulations were prepared as 10% solids. Plates were prepared as described in EXAMPLE 1 except that the following photosensitive layer formulations (solid weight ratios listed) are used.

| Material | Formula E | Formula H | Formula I |
|---|---|---|---|
| Neocryl B-728 | 37.378 | 35.711 | 34.187 |
| Sartomer SR454 | 7.490 | 7.156 | 6.850 |
| Sartomer SR399 | 46.757 | 44.672 | 42.766 |
| Pluronic L43 | 4.666 | 4.458 | 4.268 |
| Leuco crystal violet | 1.400 | 1.337 | 1.280 |
| MEHQ | 0.105 | 0.100 | 0.096 |
| Irganox 1035 | 0.105 | 0.100 | 0.096 |
| Triazine B | 2.100 | 2.006 | 1.921 |
| Polyemulsion 325G | 0.000 | 4.458 | 8.536 |

The plates were evaluated with the same procedures as in Example 1. All the plates showed good press durability. The tackiness and developability results are listed in the following table.

| Material | Formula E | Formula H | Formula I |
|---|---|---|---|
| Polyemulsion 325G | 0.000 | 4.458 | 8.536 |
| Tackiness | Medium tacky | Slight tacky | Non-tacky |
| On-press developability | 3 | 4 | 4 |

EXAMPLE 6

This example demonstrates incorporation of a particulate solid material into the photosensitive layer of a plate which is sensitized to a visible light. The photosensitive formulations were prepared as 10% solids in methylethylketone. The solid material ratios of the photosensitive layer were tabulated below.

| Material | Formula J | Formula K | Formula L | Formula M |
|---|---|---|---|---|
| Neocryl B-728 | 36.505 | 34.914 | 33.456 | 30.877 |
| Sartomer SR399 | 52.981 | 50.671 | 48.555 | 44.812 |
| Pluronic L43 | 4.170 | 3.988 | 3.822 | 3.527 |
| Leuco crystal violet | 1.367 | 1.308 | 1.253 | 1.156 |
| BHT | 0.210 | 0.201 | 0.192 | 0.177 |
| Irganox 1035 | 0.210 | 0.201 | 0.192 | 0.177 |
| Irgacure 784 | 4.557 | 4.359 | 4.177 | 3.855 |
| Microlith Green G-K | 0.000 | 4.359 | 8.354 | 15.419 |

The same aluminum substrate as in Example 1 was used. The photosensitive layer was coated onto the aluminum substrate using a #6 Meyer rod to achieve a dry coverage of about 1.1 g/m², followed by drying in an oven at 80° C. for 10 min. An water-soluble overcoat (2% Airvol 603 in water) was further coated onto the photosensitive layer using a #6 Meyer rod to achieve a coverage of about 0.2 g/m², followed by drying in an oven at 100° C. for 5 min.

The plate was exposed under a negative mask in a vacuum frame with an office-type fluorescence light source (total of 120 watts) for 10 min. The same tests as in EXAMPLE 1 were performed. All the plates showed good press durability. The tackiness and developability results are listed in the following table.

| Material | Formula J | Formula K | Formula L | Formula M |
|---|---|---|---|---|
| Microlith Green G-K | 0.000 | 4.359 | 8.354 | 15.419 |
| Tackiness | Medium tacky | Slight tacky | Non-tacky | Non-tacky |
| On-press developability | 3 | 4 | 4 | 3 |

I claim:

1. A method of lithographically printing images on a receiving medium, comprising:
    (a) providing a negative-working lithographic plate comprising:
        (i) a printing plate substrate with a hydrophilic surface on at least one side; and
        (ii) an oleophilic photosensitive layer deposited on the hydrophilic surface, said photosensitive layer comprising a photohardenable composition, and a non-hydrophilic solid particulate dispersion; wherein the unexposed areas of said photosensitive layer are softenable and dispersible by ink;
    (b) exposing said lithographic plate with an actinic radiation to cause hardening of the exposed areas;
    (c) directly placing the exposed plate on a printing press equipped with ink and fountain solution; and
    (d) operating said printing press to contact said exposed plate with ink and fountain solution to remove the photosensitive layer in the unexposed areas, and to lithographically print images from said plate to the receiving sheets.

2. The method of claim 1 wherein said photosensitive layer comprises, at least, an oleophilic polymeric binder, a monomer having at least one crosslinkable unsaturated group, a photoinitiator, and a non-hydrophilic solid particulate dispersion.

3. The method of claim 2 wherein said monomer is an acrylic monomer having at least one acrylate or methacrylate group, and said photoinitiator is a photosensitive free-radical initiator.

4. The method of claim 1 wherein said non-hydrophilic solid particulate dispersion has an average particle size from about 0.02 to about 1.0 micrometer.

5. The method of claim 1 wherein said non-hydrophilic solid particulate dispersion comprises a polymeric particulate dispersion.

6. The method of claim 5 wherein said polymeric particulate dispersion is selected from the group consisting of particulate polyethylene, particulate polypropylene, and particulate ethylene propylene copolymer.

7. The method of claim 1 wherein said non-hydrophilic solid particulate dispersion comprises a particulate inorganic mineral.

8. The method of claim 7 wherein said inorganic mineral is titanium dioxide.

9. The method of claim 1 wherein said non-hydrophilic solid particulate dispersion comprises a particulate organic solid material.

10. The method of claim 9 wherein said particulate organic solid material is an organic pigment.

11. The method of claim 10 wherein said organic pigment is selected from the group consisting of metal phthalocyanines and derivatives of metal phthalocyanines.

12. The method of claim 11 wherein said particulate organic pigment is selected from the group consisting of copper phthalocyanine and halogenated copper phthalocyanine.

13. The method of claim 1 wherein said substrate is a grained and anodized aluminum, with a hydrophilic barrier layer coated on the surface.

14. The method of claim 13 wherein the substrate is grained through an electrochemical graining process.

15. The method of claim 13 further including a water-soluble polymer layer interposed between the photosensitive layer and the substrate, said water-soluble polymer layer having an average coverage of about 1 to about 200 mg/m².

16. The method of claim 15 wherein said water-soluble polymer is polyvinyl alcohol.

17. The method of claim 1 further including a water-soluble or water-dispersible layer on the photosensitive layer.

18. A method of lithographically printing images on a receiving medium, comprising:
    (a) providing a negative-working lithographic plate comprising:
        (i) a printing plate substrate with a hydrophilic surface on at least one side; and
        (ii) an oleophilic photosensitive layer deposited on the hydrophilic surface, said photosensitive layer comprising, at least, an oleophilic polymeric binder, a monomer having at least one acrylate or methacrylate group, a photosensitive free-radical initiator, and a non-hydrophilic solid particulate dispersion; wherein the unexposed areas of said photosensitive layer are softenable and dispersible by ink;
    (b) exposing said lithographic plate with an actinic radiation to cause hardening of the exposed areas;
    (c) directly placing the exposed plate on a printing press equipped with ink and fountain solution; and
    (d) operating said printing press to contact said exposed plate with ink and fountain solution to remove the photosensitive layer in the unexposed areas, and to lithographically print images from said plate to the receiving sheets.

19. The method of claim 18 wherein said non-hydrophilic solid particulate dispersion is a pigment dispersion.

20. The method of claim 19 wherein said pigment dispersion is selected from the group consisting of copper phthalocyanine dispersions and halogenated copper phthalocyanine dispersions.

* * * * *